United States Patent
Makiyama et al.

(10) Patent No.: US 7,419,894 B2
(45) Date of Patent: Sep. 2, 2008

(54) GATE ELECTRODE AND MANUFACTURING METHOD THEREOF, AND SEMICONDUCTOR DEVICE AND MANUFACTURING METHOD THEREOF

(75) Inventors: Kozo Makiyama, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 304 days.

(21) Appl. No.: 11/062,588

(22) Filed: Feb. 23, 2005

(65) Prior Publication Data

US 2005/0159009 A1    Jul. 21, 2005

Related U.S. Application Data

(63) Continuation of application No. PCT/JP03/09865, filed on Aug. 4, 2003.

(30) Foreign Application Priority Data

Aug. 28, 2002    (JP)    ............................... 2002-249390

(51) Int. Cl.
*H01L 21/28*    (2006.01)
(52) U.S. Cl. ........................ 438/579; 438/671; 438/950; 257/E21.453
(58) Field of Classification Search .................. 438/182, 438/572, 573, 574, 576, 577, 578, 579, 671, 438/950; 257/E21.453, E21.587
See application file for complete search history.

(56) References Cited

U.S. PATENT DOCUMENTS 6,153,499 A * 11/2000 Anda et al. .................. 438/579
6,503,671 B1    1/2003 Nakajima

FOREIGN PATENT DOCUMENTS

| JP | 61-284969 | 12/1986 |
| JP | 7-193088 | 7/1995 |
| JP | 10-107044 | 4/1998 |
| JP | 11-352692 | 12/1999 |
| JP | 2001-189283 | 7/2001 |
| TW | 460936 | 10/2001 |

* cited by examiner

*Primary Examiner*—Chandra Chaudhari
(74) *Attorney, Agent, or Firm*—Kratz, Quintos & Hanson, LLP (57) ABSTRACT

The present invention provides a method of manufacturing a gate electrode in which a fine gate electrode can effectively be manufactured by thickening a resist opening for gate electrodes formed by ordinary electron beam lithography so as to reduce opening dimensions. The method of manufacturing a gate electrode of the present invention includes a step of forming a laminated resist including at least an electron beam resist layer as a lowermost layer on a surface where a gate electrode is to be formed; a step of forming an opening in layer(s) other than the lowermost layer; a step of forming a gate electrode opening on the lowermost layer exposed from the opening; a step of reducing the gate electrode opening selectively; and a step of forming a gate electrode in the gate electrode opening.

30 Claims, 5 Drawing Sheets

GATE ELECTRODE AND MANUFACTURING METHOD THEREOF, AND SEMICONDUCTOR DEVICE AND MANUFACTURING METHOD THEREOF

CROSS-REFERENCE TO RELATED APPLICATIONS

This is a continuation of Application PCT/JP2003/009865, filed on Aug. 4, 2003.

BACKGROUND OF THE INVENTION

1. Field of the Invention

The present invention relates to a method of manufacturing a gate electrode in which a fine gate electrode can effectively be manufactured by thickening a resist opening for gate electrodes formed by ordinary electron beam lithography so as to reduce opening dimensions, to a gate electrode which is manufactured by the method of manufacturing a gate electrode and is used favorably for a field-effect transistor which has excellent high frequency properties and is useful for a transmitting and receiving device of quasi-millimeter and millimeter band waves or a high-speed signal processing (optical communication) device, and to a semiconductor device using the gate electrode and method of manufacturing thereof.

2. Description of the Related Art

Field-effect transistors having superior high frequency properties are useful as devices for transmission/reception of quasi-milliwave and milliwave band radio waves or as devices in high-speed signal processing (for optical communications). In the developments of the gate electrode used for the device, particularly in which excellent high frequency properties are required, there has been extensive effort on making the gate length as short as possible by forming opening for forming gate using electron beam lithography.

In the related art, to form micro-openings for gates by electron beam lithography, it was proposed to (1) make the electron beam used for patterning very fine so as to form a fine pattern, and (2) apply heat to the resist in which the opening for the gate electrode is formed, thereby softening it to reduce the opening dimensions.

However, there are the following problems in these cases. Specifically, in (1), although in the related art it was possible to make the electron beam diameter as fine as 0.04 µm, this technique was still inadequate from the viewpoint of stable manufacture when several thousands of transistors were assembled. In (2), because the amount of the reduction of the opening dimensions obtained stably is about 0.04 µm or less, reducing the opening dimensions drastically beyond this creates problems in the uniformity, and is not suited for mass-production. Further, it was inherently difficult to use the same opening to form both a recess opening and gate electrode opening which have a large dimensional difference.

Accordingly, an object of the present invention is to provide a method of manufacturing a gate electrode in which a fine gate electrode can effectively be manufactured by thickening a resist opening for gate electrodes formed by ordinary electron beam lithography so as to reduce opening dimensions. Another object of the present invention is to provide a gate electrode which is manufactured by the method of manufacturing a gate electrode and is used favorably for a field-effect transistor which has excellent high frequency properties and is useful for a transmitting and receiving device of quasi-millimeter and millimeter band waves or a high-speed signal processing (optical communication) device. Yet another object of the present invention is to provide a high-performance semiconductor device using the gate electrode, and a method of efficiently manufacturing thereof.

SUMMARY OF THE INVENTION

The method of manufacturing a gate electrode of the present invention includes a step of forming a multi-layer resist including at least an electron beam resist layer as a lowermost layer on a surface where a gate electrode is to be formed; a step of forming an opening an opening in layer(s) other than the lowermost layer; a step of forming a gate electrode opening on the lowermost layer exposed from the opening; a step of reducing the gate electrode opening selectively; and a step of forming a gate electrode in the gate electrode opening.

In the method of manufacturing a gate electrode of the present, in the step of forming a multi-layer resist, the multi-layer resist including at least an electron beam resist layer as the lowermost layer, is formed on the surface where a gate electrode is to be formed. In the step of forming an opening, an opening is formed in layer(s) other than the lowermost layer. In the step of forming a gate electrode opening, the gate electrode opening is formed in the lowermost layer exposed from the opening. In the step of reducing a gate electrode opening, the gate electrode opening is selectively reduced. In the step of forming a gate electrode, the gate electrode is formed in the gate electrode opening. Due to this process, a high-performance, fine gate electrode can be manufactured.

If a step of exposing to an electron beam in which the vicinity of the gate electrode opening is exposed to an electron beam, is included before the step of reducing a gate electrode opening, the reduction amount of the opening dimension of the gate electrode opening in the step of reducing a gate electrode opening, can be adjusted by varying the exposure dose of electron beam.

Further, if a step of engraving a surface where a gate electrode is to be formed using the gate electrode opening as a mask, is included after the step of forming a gate electrode opening and before the step of reducing a gate electrode opening, a wide gate electrode opening formed in the step of forming a gate electrode opening may be used as a mask to form a recess region, and by subsequently performing the step of reducing a gate electrode opening until a desired gate electrode opening is obtained, the gate electrode can then be easily formed at a predetermined position without any offset in the recess region.

The gate electrode of the present invention is manufactured by the method of manufacturing a gate electrode of the present invention. The gate electrode has a short gate length and a fine structure, so that it can be used favorably for a field-effect transistor which has excellent high frequency properties and is useful for a transmitting and receiving device of quasi-millimeter and millimeter band waves or a high-speed signal processing (optical communication) device.

The method of manufacturing a semiconductor device of the present invention includes the method of the method of manufacturing a gate electrode of the present invention. In the method of manufacturing a semiconductor device of the present invention, a fine gate electrode can be formed, so a high-performance semiconductor device wherein a large number of field effect transistors using this gate electrode are stably assembled can be efficiently manufactured. Further, according to the method of manufacturing a gate electrode, a plurality of gate electrodes having different fineness degrees can be formed, and a plurality of offset gates in which the offset amount is optionally adjusted can also be formed, therefore, a semiconductor device having multiple functions and high-performance can be efficiently and easily manufactured.

The semiconductor device of the present invention is manufactured by the method of manufacturing a semiconductor device. The semiconductor device of the present invention includes fine gate electrodes suitable for field effect transistors or the like, and is, therefore, high-performance. Also, if a plurality of gate electrodes having different fineness degrees are provided, or a plurality of offset gates in which the offset amount is optionally adjusted are provided, the device has multiple functions together with high performance.

DESCRIPTION OF THE PREFERRED EMBODIMENTS (Gate Electrode and Manufacturing Method Thereof)

The method of manufacturing a gate electrode of the present invention gate electrode manufacturing method of the present invention comprises a step of forming a multi-layer resist, a step of forming an opening, a step of forming a gate electrode opening, a step of reducing a gate electrode opening and a step of forming a gate electrode, and may comprise other steps suitably selected as required.

The gate electrode of the present invention is manufactured by the method of manufacturing a gate electrode of the present invention. Hereinafter, the details of the gate electrode of the present invention will be made clear through description of the method of manufacturing a gate electrode of the present invention.

Step of Forming Multi-layer Resist

The step of forming a multi-layer resist is a step which forms a multi-layer resist comprising at least an electron beam resist layer as the lowermost layer on the surface where a gate electrode is to be formed.

The surface where a gate electrode is to be formed is not particularly limited, and may be suitably selected according to the purpose. Examples thereof are surfaces where a gate electrode is to be formed in various semiconductor devices and the like. Among these, the surface where a gate electrode is to be formed in field-effect transistors which is useful for a transmitting and receiving device of quasi-millimeter and millimeter band waves or a high-speed signal processing (optical communication) device.

It is preferable that an ohmic electrode be formed on the surface where a gate electrode is to be formed. The ohmic electrode is not particularly limited and may be and may be suitably selected from among those known in the art. For instance, exemplified is the one where a buffer layer, InGaAs electron transit layer, an AlGaAs electron supply layer, and a GaAs low-resistance layer are grown on a semi-insulating GaAs substrate. Each layer of the ohmic electrode may be laminated by vacuum vapor deposition and the like. An active region may be formed by injecting oxygen in order to separate the elements mutually electrically.

A nitride film such as SiN may also be formed on the surface where a gate electrode is to be formed to improve adhesion between the surface where a gate electrode is to be formed and the multi-layer resist.

Moreover, a low-resistance layer may be formed on the surface where a gate electrode is to be formed and a recess region may be formed by removing the low-resistance layer part through an etching process etc.

The multi-layer resist is not particularly limited as long as it comprises at least an electron beam resist layer as the lowermost layer, and the number of laminated layers, resist type, layer thickness and opening diameters may be suitably selected according to the purpose.

The structure of the multi-layer resist is not particularly limited and can be suitably selected according to the purpose, for example, it may comprise three layers, i.e., a lowermost layer in which a gate electrode opening for forming base part of the gate electrode is formed, an intermediate layer for attaining easy lift-off, and an uppermost layer.

The material of the lowermost layer is not particularly limited as long as it is an electron beam resist and may be suitably selected according to the purpose, but it is preferred that the material can be thickened by the resist pattern thickening material, and for example, polymethyl methacrylate (PMMA) is particularly preferred. The PMMA resist includes PMMA resin itself and derivatives of the PMMA resin in which substituents are introduced.

If the lowermost layer is a polymethyl methacrylate (PMMA) resist, the thickening effect due to the resist pattern thickening material is excellent, which is an advantage.

The material of the intermediate layer is not particularly limited and may be suitably selected according to the purpose, but it is preferably a material which is not thickened by the resist pattern thickening material, and from the viewpoint of efficiently forming an overgate part of the gate electrode, a material which can be side-etched is more preferred. For example, polymethyl glutarimide (PMGI) is preferred.

The material of the uppermost layer is not particularly limited and may be suitably selected according to the purpose, but a material which is thickened to a lesser extent by the resist pattern thickening material than the lowermost layer in which the gate electrode opening is formed, is preferred, and although it may be suitably selected from among an electron beam resist, photoresist and the like known in the art, a polystyrene polymer-containing resist containing a polystyrene polymer and an acrylic resin is preferred.

Commercial products may be used suitably as the materials of the layers in the multi-layer resist.

The layers in the multi-layer resist may be formed by coating the resist material of each layer, and drying. The coating method is not particularly limited and may be suitably selected from among those known in the art according to the purpose, e.g., spin coating or the like.

In the present invention, the multi-layer resist is preferably a three layer structure in which the lowermost layer is formed of the polymethyl methacrylate (PMMA) resist, the intermediate layer is formed of the polymethyl glutarimide (PMGI), and the uppermost layer is formed of the polystyrene polymer-containing resist, from the viewpoint that the gate electrode opening (fine gate opening) can be stably formed so that gate electrode manufacture is both stable and efficient.

Step of Forming Opening

The step of forming an opening is a step which forms an opening in layer(s) other than the lowermost layer.

The method for forming the opening in the layer(s) other than the lowermost layer is not particularly limited and may be selected according to the purpose. For example, if the multi-layer resist has a three-layer structure comprising the lowermost layer, intermediate layer and uppermost layer, a suitable method is to form an uppermost layer opening in the uppermost layer by electron beam lithography of the uppermost layer, to form an intermediate layer opening in the intermediate layer by alkali developing treatment of the intermediate layer from the uppermost layer opening, and to side-etch (setback forming) this intermediate layer opening.

The electron beam lithography may be performed using an electron beam lithography apparatus known in the art. The alkali developing treatment may be performed under conditions known in the art using an alkali developing solution known in the art.

If the intermediate layer opening is side-etched (setback forming), a space for forming the overgate part of the gate electrode can be formed, and lift-off is easy which is preferred.

The dimensions of the uppermost layer opening formed in the uppermost layer of the multi-layer resist are not particularly limited and may be suitably selected according to the purpose. For example, it is preferably about 0.20 to 1.00 μm.

Step of Forming Gate Electrode Opening

The step of forming a gate electrode opening is a step which forms the gate electrode opening (fine gate opening) in the lowermost layer.

The gate electrode opening (fine gate opening) may be formed by electron beam lithography of the lowermost layer.

The electron beam lithography method is not particularly limited, and may be performed by an electron beam lithography apparatus known in the art under conditions known in the art according to the purpose.

The dimensions of the gate electrode opening formed by the electron beam lithography are not particularly limited and may be suitably selected according to the purpose. For example, they are about 0.1 to 0.2 μm.

Step of Reducing Gate Electrode Opening

The step of reducing a gate electrode opening is a step which selectively reduces the gate electrode opening.

The method of reducing the size of the gate electrode opening is not particularly limited and may be suitably selected according to the purpose. For example, a method in which a treatment for reducing the opening dimensions (diameter) is performed at least once, is particularly preferred. The treatment is performed by coating and developing the resist pattern thickening material on the gate electrode opening (forming the opening).

The resist pattern thickening material may be such that, even if the lowermost layer is a neutral resist material such as a polymethyl methacrylate (PMMA) resist, the resist pattern thickening material has an excellent thickening effect, and can efficiently thicken the gate electrode opening formed in the lowermost layer.

In the step of reducing a gate electrode opening, the resist pattern thickening material is suitably used. In this case, when the resist pattern thickening material is coated on the gate electrode opening and is crosslinked, the gate electrode opening is thickened, a surface layer is formed on the gate electrode opening, and the opening dimensions (size) of the gate electrode opening are reduced. As a result, a finer gate electrode opening is formed than would be possible with the resolution limit of the electron beam used to form the uppermost layer opening.

At this time, the thickening amount of the gate electrode opening, i.e., the dimension reduction amount of the gate electrode opening, can be controlled to within a desired range by suitably adjusting the composition, composition ratio, blending amount, concentration, viscosity, coating thickness, baking temperature and baking time of the resist pattern thickening material.

The composition, composition ratio, blending amount, concentration and viscosity etc. of the resist pattern thickening material are not particularly limited and may be suitably selected according to the purpose. From the viewpoint of controlling the thickening amount of the gate electrode opening, i.e., the reduction amount of the gate electrode opening dimensions (diameter), it is preferred that the total content of components other than water in the resist pattern thickening material is 5 to 40% by mass. The opening dimension reduction amount may also be adjusted according to the concentrations of the resin, surfactant and crosslinking agent in the resist pattern thickening material.

Resist Pattern Thickening Material

The resist pattern thickening material contains a resin, a crosslinking agent and a surfactant. As needed, the resist pattern thickening material may further contain a water-soluble aromatic compound, a resin comprising an aromatic compound in a portion thereof, an organic solvent and other components.

The resist pattern thickening material is water-soluble or alkali-soluble.

The resist pattern thickening material may be an aqueous solution, colloidal solution or an emulsion, but an aqueous solution is preferred.

The resin is not particularly limited and may be suitably selected according to the purpose, but a water-soluble or alkali-soluble resin is preferred, and a resin which can cause a crosslinking reaction or a resin which can be mixed with a water-soluble crosslinking agent if it does not cause a crosslinking reaction, is more preferred.

When the resin is water-soluble resin, the water-soluble resin preferably exhibits water-solubility of 0.1 g or more in 100 g of water at a water temperature of 25° C.

The water-soluble resin may for example be polyvinyl alcohol, polyvinyl acetal, polyvinyl acetate, polyacrylic acid, polyvinyl pyrrolidone, polyethyleneimine, polyethylene oxide, styrene-maleic acid copolymer, polyvinylamine, polyallylamine, an oxazoline group-containing water-soluble resin, water-soluble melamine resin, water-soluble urea resin, alkyde resin or sulfonamide resin.

When the resin is alkali-soluble, the alkali-soluble resin preferably exhibits alkali solubility of 0.1 g or more in 100 g of a 2.38% by mass TMAH aqueous solution at a solution temperature of 25° C.

Examples of the alkali-soluble resin are novolak resin, vinylphenol resin, polyacrylic acid, polymethacrylic acid, poly p-hydroxyphenylacrylate, poly p-hydroxyphenylmethacrylate, and copolymers thereof.

The resin may be used alone, or two or more may be used in combination. Among these, polyvinyl alcohol, polyvinyl acetal and polyvinyl acetate are preferred.

The content of the resin in the resist pattern thickening material depends on the kind and content of the crosslinking agent, so that it is impossible for it to be prescribed unconditionally. However, the content may be suitably selected according to the purpose.

The crosslinking agent is not particularly limited and may be suitably selected according to the purpose, but it is preferably a water-soluble material which causes crosslinking by the action of heat or acid, an example being an amino crosslinking agent.

Suitable examples of the amino crosslinking agent are a melamine derivative, a urea derivative, and an uril derivative. These may be used alone, or two or more may be used in combination.

Examples of the urea derivative include urea, alkoxymethylene urea, N-alkoxymethylene urea, ethylene urea, ethylene urea carboxylic acid, and their derivatives.

Examples of the melamine derivative are alkoxymethyl melamine, and their derivatives.

Examples of the uril derivative are benzoguanamine, glycol uril, and their derivatives.

The content of the crosslinking agent in the resist pattern thickening material depends on the type and content of the resin, so that it is impossible for it to be prescribed unconditionally. However, it can be suitably selected according to the purpose.

The surfactant is not particularly limited and may be suitably selected according to the purpose. Examples of the surfactant include a nonionic surfactant, a cationic surfactant, a anionic surfactant, and an ampholytic surfactant. These may be used alone, or two or more may be used in combination. Among these, the non-ionic surfactant is preferred from the viewpoint that it does not contain metal ions.

Suitable examples of the nonionic surfactant are the ones selected from an alkoxylate surfactant, fatty acid ester surfactant, amide surfactant, alcoholic surfactant, and ethylenediamine surfactant. Specific examples of these include a polyoxyethylene-polyoxypropylene condensation compound, polyoxy alkylene alkylether compound, polyoxy ethylene alkylether compound, polyoxy ethylene derivative compound, sorbitan fatty acid ester compound, glycerine fatty acid ester compound, primary alcohol ethoxylate compound, phenol ethoxylate compound, nonyl phenol ethoxylate compound, octyl phenol ethoxylate compound, lauryl alcohol ethoxylate compound, oleyl alcohol ethoxylate compound, fatty acid ester, amide, natural alcohol, ethylenediamine and secondary alcohol ethoxylate. Specific examples of these include a polyoxyethylene-polyoxypropylene condensation compound, polyoxy alkylene alkylether compound, polyoxy ethylene alkylether compound, polyoxy ethylene derivative compound, sorbitan fatty acid ester compound, glycerine fatty acid ester compound, primary alcohol ethoxylate compound, phenol ethoxylate compound, nonyl phenol ethoxylate compound, octyl phenol ethoxylate compound, lauryl alcohol ethoxylate compound, oleyl alcohol ethoxylate compound, fatty acid ester, amide, natural alcohol, ethylenediamine and secondary alcohol ethoxylate.

The cationic surfactant is not particularly limited and may be suitably selected according to the purpose. Examples thereof include alkyl cationic surfactant, amide quaternary cationic surfactant, and ester quaternary cationic surfactant.

The amphoteric surfactant is not particularly limited and may be suitably selected according to the purpose. Examples thereof include an amine oxide surfactant and betaine surfactant.

The content of the surfactant in the resist pattern thickening material depends on the type and content of the resin and crosslinking agent, so that it is impossible for it to be prescribed unconditionally. However, the content may be suitably selected according to the purpose.

When the resist pattern thickening material contains a water-soluble aromatic compound, the preferable point is that the etching resistance of the gate electrode opening can be remarkably improved.

The water-soluble aromatic compound is not particularly limited, as long as it is an aromatic compound that has water-solubility, and it can be suitably selected according to the purpose. The compound having water-solubility such that 1 g or more is dissolved into 100 g of water at 25° C. is preferable, and the compound having water-solubility such that 3 g or more is dissolved into 100 g of water at 25° C. is more preferable. Particularly, the most preferable is the compound having water-solubility such that 5 g or more is dissolved into 100 g of water at 25° C.

Examples of the water-soluble aromatic compound are a polyphenol compound, an aromatic carboxylic acid compound, a naphthalene polyhydric alcohol compound, a benzophenone compound, a flavonoid compound, a porphin, a water-soluble phenoxy resin, an aromatic-containing water-soluble dye, derivatives thereof, and glycosides thereof. These may be used alone, or two or more may be used in combination.

Examples of the polyphenol compound and its derivatives include catechin, anthocyanidin (pelargonidin-type (4'-hydroxy), cyanidin-type (3',4'-dihydroxy), delphinidin-type (3', 4',5'-trihydroxy)), flavan-3,4-diol, proanthocyanidin, resorcine, resorcine[4]arene, pyrogallol, gallic acid, and derivatives or glycosides thereof.

Examples of the aromatic carboxylic acid compound and its derivative include salicylic acid, phthalic acid, dihydroxy benzoic acid, tannin, and derivatives or glycosides thereof.

Examples of the naphthalene polyhydroxy compound and its derivative include naphthalene diol, naphthalene triol, and derivatives or glycosides thereof.

Examples of the benzophenone compound and its derivative include alizalin Yellow A, and derivatives or glycosides thereof.

Examples of the flavonoid compound and its derivative include flavone, isoflavone, flavanol, flavonone, flavonol, flavan-3-ol, aurone, chalcone, dihydrochalcone, quercetin, and derivatives or glycosides thereof.

Among the water-soluble aromatic compounds, from the viewpoint of excellent water-solubility, the compound having two or more polar groups is preferable, the compound having three or more polar groups is more preferable, and the compound having four or more is particularly preferable.

The polar group is not particularly limited and may be suitably selected according to the purpose. Examples thereof are a hydroxyl group, a carboxyl group, a carbonyl group and a sulfonyl group.

The content of the water-soluble aromatic compound in the resist pattern thickening material can be decided according to the type and content of the resin, the crosslinking agent and the like.

When the resist pattern thickening material contains a resin comprising an aromatic compound in a portion thereof, the preferable point is that the etching resistance of the uppermost layer opening can be remarkably improved.

The resin comprising an aromatic compound in a portion thereof is not particularly limited and may be suitably selected according to the purpose. However, those that can cause a crosslinking reaction are preferable. Suitable examples thereof include a polyvinyl aryl acetal resin, polyvinyl aryl ether resin, polyvinyl aryl ester resin, and derivatives thereof. It is preferable to use at least one type selected therefrom. From the viewpoint of exhibiting water-solubility or alkali-solubility to an appropriate degree, such a resin that contains an acetyl group is more preferable. These may be used alone, or two or more may be used in combination.

The polyvinyl aryl acetal resin is not particularly limited and may be suitably selected according to the purpose. Examples thereof include β-resorcinol acetal and the like.

The polyvinyl aryl ether resin is not particularly limited and may be suitably selected according to the purpose. Examples thereof include 4-hydroxybenzyl ether and the like.

The polyvinyl aryl ester resin is not particularly limited and may be suitably selected according to the purpose. Examples thereof include benzoate and the like.

The method of producing the polyvinyl aryl acetal resins is not particularly limited and may be suitably selected according to the purpose. A suitable example thereof is a known method of producing using a polyvinyl acetal reaction, or the like. The method is a method in which, for example, polyvinyl alcohol, and aldehyde in an amount needed stoichiometrically for the polyvinyl alcohol are made to undergo an acetal reaction in the presence of an acid catalyst. Specifically, suitable examples are the methods disclosed in U.S. Pat. Nos. 5,169,897 and 5,262,270, Japanese Patent Application Laid-Open (JP-A) No. 05-78414, and the like.

The method of producing the polyvinyl aryl ether resins is not particularly limited and may be suitably selected according to the purpose. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction by Williamson); and the like. Specifically, suitable examples are the methods disclosed in JP-A Nos. 2001-40086, 2001-181383, 06-116194, and the like.

The method of producing the polyvinyl aryl ester resins is not particularly limited and may be suitably selected according to the purpose. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The aromatic compound in the resin having an aromatic compound at a portion thereof, is not particularly limited and may be suitably selected according to the purpose. Suitable examples thereof are a monocyclic aromatic benzene derivative, pyridine derivative, and a compound in which a plurality of aromatic rings are fused together (polycyclic aromatic compound such as naphthalene and anthracene).

Suitable examples of the aromatic compound in the resin having an aromatic compound at a portion thereof are ones having at lease one selected from the functional groups such as, for instance, hydroxyl group, cyano group, alkoxyl group, carboxyl group, amino group, amide group, alkoxycarbonyl group, hydroxyalkyl group, sulphonyl group, acid anhydride group, lactone group, cyanate group, and ketone group and the sugar derivatives from the viewpoint of having appropriate water-solubility. The one having at least one functional group selected from the hydroxyl group, amino group, sulphonyl group, carboxyl group, and their derivatives, is more preferable.

The molar content ratio of the aromatic compound in the resin having an aromatic compound at a portion thereof, is not particularly limited as long as it does not affect the etching resistance, and may be suitably selected according to the purpose. In the case where high etching resistance is needed, the molar content ratio is preferably 5 mol % or more, and more preferably, 10 mol % or more.

The molar content ratio of the aromatic compound in the resin having an aromatic compound at a portion thereof can be measured with use of, for instance, NMR or the like.

The content of the resin having an aromatic compound at a portion thereof in the resist pattern thickening material can be decided according to the type and content of the resin, crosslinking agent and the like.

The organic solvent, when it is contained in the resist pattern thickening material, can enhance the solubility of the resin and crosslinking agent into the resist pattern thickening material.

The organic solvent is not particularly limited and may be suitably selected according to the purpose. Examples thereof are an alcohol organic solvent, straight-chain ester organic solvent, cyclic ester organic solvent, ketone organic solvent, straight-chain ether organic solvent and cyclic ether organic solvent.

Examples of the alcohol organic solvent are methanol, ethanol, propyl alcohol, isopropyl alcohol, and butyl alcohol.

Examples of the straight-chain ester organic solvent are ethyl lactate and propylene glycol methyl ether acetate (PGMEA).

Examples of the cyclic ester organic solvent are lactone organic solvents such as γ-butyrolactone.

Examples of the ketone organic solvent are ketone organic solvents such as acetone, cyclohexanone, and heptanone.

Examples of the straight-chain ether organic solvent are ethylene glycol dimethyl ether.

Examples of the cyclic ether organic solvent are tetrahydrofuran and dioxane.

These organic solvents may be used alone, or two or more may be used in combination. Among these, from the viewpoint of thickening with fine precision, solvents having a boiling point of the order of 80 to 200° C. are preferred.

The content of the organic solvent in the resist pattern thickening material may be suitably determined according to the type and content of the resin, crosslinking agent, and surfactant.

The other components are not particularly limited as long as they do not interfere with the effects of the present invention, and may be suitably selected according to the purpose. Examples are various types of known additives such as crosslinking agents, thermal acid generating agents, quenchers such as amine type, amide type, ammonium chloride type quenchers, and the like.

The content of the other components in the resist pattern thickening material may be suitably decided according to the type and content of the resin and crosslinking agent.

When the resist pattern thickening material is coated on the gate electrode opening and made to undergo crosslinking, the gate electrode opening is thickened, a surface layer is formed on the gate electrode opening, and the gate electrode opening dimensions (size) are reduced. In this way, a finer gate electrode opening is formed than would be possible with the resolution limit of the electron beam in the electron beam lithography apparatus used to form the gate electrode opening.

At this time, the thickening amount of the gate electrode opening, i.e., the reduction amount of the gate electrode opening dimensions (size), may be controlled to within a desired range by suitably adjusting the composition, composition ratio, blending amount, concentration, viscosity, coating thickness, baking temperature and baking time of the resist pattern thickening material.

The composition, composition ratio, blending amount, concentration and viscosity etc. of the resist pattern thickening material are not particularly limited and may be suitably selected according to the purpose, but from the viewpoint of controlling the thickening amount of the gate electrode opening, i.e., the reduction amount of the gate electrode opening dimensions (diameter), it is preferred that the total content of components other than water in the resist pattern thickening material is 5 to 40% by mass.

Developing may be performed after the coating. If developing is performed, excess resist pattern thickening material which has not formed a mixing layer with the lowermost layer can be removed.

The developing may be performed by means of water or a weakly alkaline solution, but from the viewpoint of performing efficient developing at low cost, water developing is preferred.

In the step of reducing a gate electrode opening, by performing the processing from coating to developing at least once, and a plurality of times if required, the gate electrode opening dimensions can be controlled to any desired degree.

The method of coating the resist pattern thickening material is not particularly limited and may be suitably selected from among coating methods known in the art according to the purpose, for example, spin-coating method. In the case of the spin coating method, the condition is, for instance, a rotation speed of about 100 to 10000 rpm, and the preferable rotation speed is 800 to 5,000 rpm. The preferable time is about 1 second to 10 minutes, and 1 second to 90 seconds is more preferable.

The coating thickness in the coating is usually about 100 to 10,000 Å (about 10 to 1,000 nm), and the preferable thickness is about 2,000 to 5,000 Å (about 200 to 500 nm).

In the coating, the surfactant may be coated separately before coating the resist pattern thickening material without adding the surfactant into the resist pattern thickening material.

During or after the coating, it is preferable to prebake (heat and dry) the coated resist pattern thickening material from the viewpoint of efficiently mixing (impregnating) the resist pattern thickening material in the lowermost layer at the interface between the lowermost layer and resist pattern thickening material.

The prebaking (heating and drying) conditions and method are not particularly limited as long as the lowermost layer is not softened, and may be suitably selected according to the purpose, but for example the temperature is about 40 to 120° C., preferably 70 to 100° C., and the time is about 10 seconds to 5 minutes, preferably 40 seconds to 100 seconds.

Moreover, after prebake (heating and drying), a crosslinking bake (crosslinking reaction) of the resist pattern thickening material is preferably performed from the viewpoint of efficiently promoting the crosslinking reaction of the mixing (impregnated) part at the interface between the lowermost layer and resist pattern thickening material.

The conditions and method for the crosslinking bake (crosslinking reaction) are not particularly limited as long as the lowermost layer is not softened, and may be suitably selected according to the purpose. A higher temperature is normally employed than that employed for the prebake (heating and drying). The condition of the crosslinking bake (crosslinking reaction) is about 70 to 150° C. in the temperature and the preferable temperature is 90 to 130° C. The time is about 10 seconds to 5 minutes and the preferable time is 40 seconds to 100 seconds.

After the crosslinking bake (crosslinking reaction), a developing treatment is preferably given to the coated resist pattern thickening material. In this case, the part of the resist pattern thickening material which is not crosslinked or the part which is only weakly crosslinked with the lowermost layer (part with high water solubility) can be dissolved away, and a thickened resist pattern can be developed (obtained), which is preferred.

Step of Forming Gate Electrode

The step of forming a gate electrode is a step in which a gate electrode is formed in the gate electrode opening.

The method of forming the gate electrode is not particularly limited and may be suitably selected according to the purpose. A suitable example is vapor deposition.

The metallic material which is vapor-deposited by vapor deposition may be suitably selected from among electrode materials known in the art. For example, Al, Ti, Pt, and Au etc. can be given as the preferable example. These may be used alone, or two or more may be used in combination. Moreover, these metals may be deposited to form the T-shaped electrode. In this case, the aspects forming the T-shaped electrode by lamination of, for instance, Ti, Pt, and Au are given as the preferable examples.

After forming the gate electrode, the multi-layer resist must be removed, and the multi-layer resist may be removed by, for example, the lift-off method or etching. Among these, the lift-off method is preferred. The conditions of these methods are not particularly limited and may be suitably selected from known conditions in the art.

In the step of forming a gate electrode, a T-shaped electrode is formed in the opening formed through the multi-layer resist. Specifically, the base part of the gate electrode is formed in the gate electrode opening part, and the overgate part of the gate electrode is formed in the opening which was formed by side-etching. The multi-layer resist is then removed so as to obtain the gate electrode.

Other Steps

The other steps are not particularly limited and may be suitably selected according to the purpose. For example, a step of exposing the vicinity of the gate electrode opening in the lowermost layer to an electron beam, and a step of engraving the surface where the gate electrode is to be formed using the gate electrode opening as a mask.

Hereinafter, the engraved portion of the surface where the gate electrode is to be formed, which portion is engraved in the step of engraving the surface where the gate electrode is to be formed, may be referred to as the "recess region", and the end wall surface of the "recess region" may be called the "recess end".

Step of Exposing to an Electron Beam

The step of exposing to an electron beam is performed before the step of reducing a gate electrode opening, and is a step in which the vicinity of the gate electrode opening in the in the lowermost layer is exposed to an electron beam.

The step of exposing to an electron beam may be performed before or after the step of forming an opening, or, before or after the step of forming a gate electrode opening.

The exposure dose of an electron beam to the lowermost layer in the step of exposing to an electron beam is preferably a dosage amount below the developing Eth (maximum dosage amount at which the resist has no solubility in the developing solution, hereinafter idem). If the exposure dose is less than the developing Eth, the lowermost layer can be efficiently thickened without patterning the lowermost layer, which is desirable.

Figure 1:
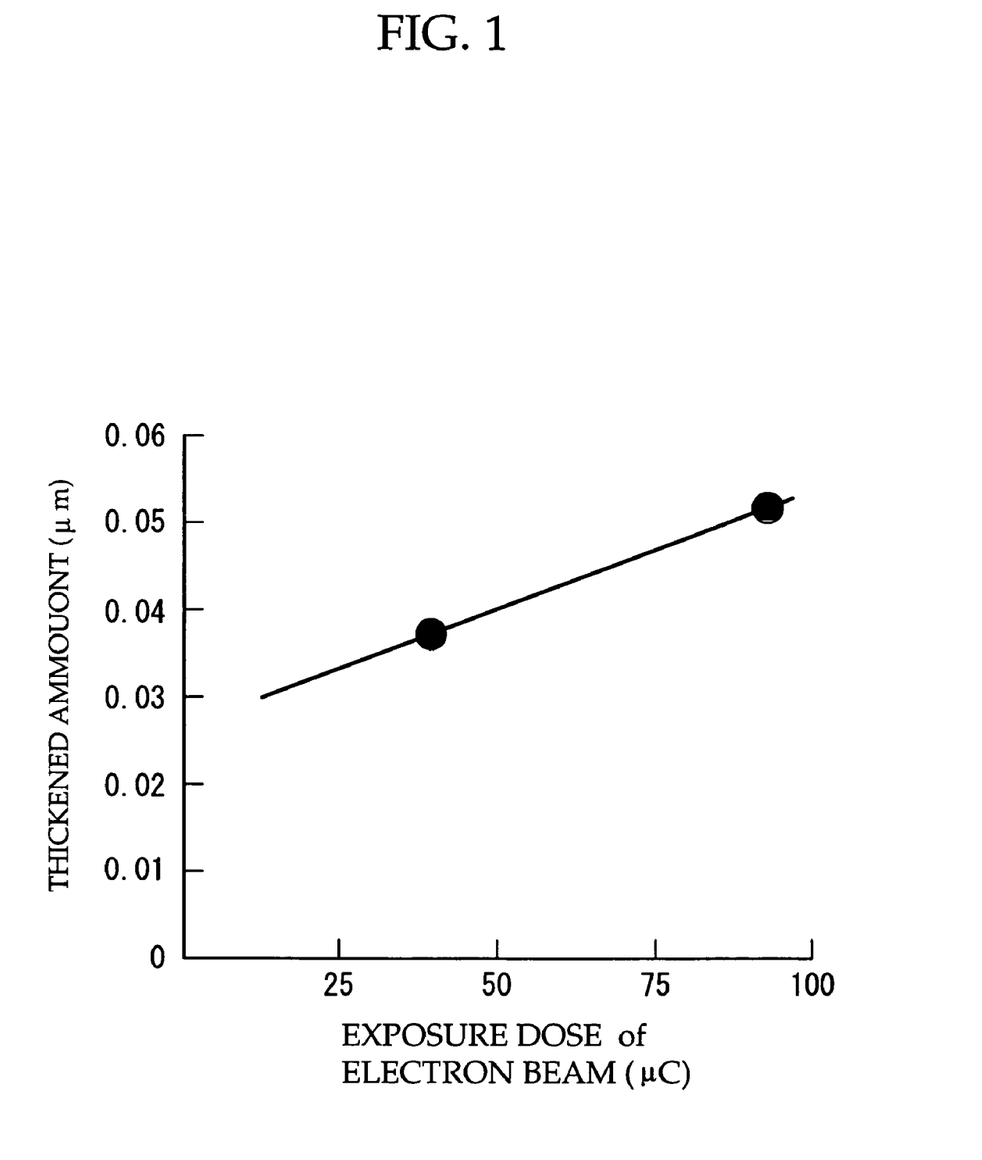
FIG. 1 is a graph showing a relation between an exposure dose of electron beam and a thickened resist amount.

In the present invention, in the step of exposing to an electron beam, when the electron beam is irradiated to the lowermost layer, the lowermost layer part to which the electron beam is exposed, is more easily thickened by the resist pattern thickening material. FIG. 1 shows the relation between the exposure dose of an electron beam and a thickened amount of a resist pattern at a thickening temperature of 95° C. As shown in FIG. 1, the exposure dose of the electron beam to the lowermost layer is substantially proportional to the thickened amount due to the resist pattern thickening material. Therefore, by suitably varying the exposure dose of the electron beam in the step of exposing to an electron beam, the reduction amount of the opening dimensions of the gate electrode opening can be optionally adjusted. Moreover, among a plurality of gate electrode openings formed by electron beam lithography in the lowermost layer, openings having different opening dimensions can be formed, and gate electrodes having different fineness degrees can be separately manufactured as desired on the same surface where a gate electrode is to be formed.

In the step of exposing to an electron beam, the electron beam may be exposed to the lowermost layer by exposing the vicinity of the gate electrode opening to an electron beam uniformly or symmetrically, or by exposing the vicinity of the gate electrode opening to an electron beam non-uniformly or non-symmetrically.

If the vicinity of the gate electrode opening electron beam is exposed uniformly or symmetrically, the vicinity of the gate electrode opening can be thickened substantially uniformly or symmetrically, and at the time of the step of forming a gate electrode, the opening and gate electrode opening are positioned concentrically. When a recess region is formed using the gate electrode opening and a transistor is designed so as to provide a source electrode and a drain electrode together with the gate electrode to be obtained, the distance between the source electrode side end of the gate electrode and the recess end on the source electrode side of the recess region where a gate electrode is to be formed, can be made identical to the distance between the recess end on the drain electrode side of the recess region where a gate electrode is to be formed and the drain electrode side end of the gate electrode.

If the vicinity of the gate electrode opening electron beam is exposed to the electron beam non-uniformly or non-symmetrically, the vicinity of the gate electrode opening can be thickened non-uniformly or non-symmetrically, and at the time of the step of forming a gate electrode, the opening formed in the step of forming an opening and the gate electrode opening are not positioned concentrically. When the recess region is formed using the gate electrode opening and a transistor is designed so as to provide a source electrode and a drain electrode together with the gate electrode to be obtained, the distance between the source electrode side end of the gate electrode and the recess end on the source electrode side of the recess region where a gate electrode is to be formed, can be made different from the distance between the recess end on the drain electrode side of the recess region where a gate electrode is to be formed and the drain electrode side end of the gate electrode (manufacture of "offset gate or offset recess").

Herein, describing the manufacture of offset gate in more detail, if, for example, it is desired to make the distance between the gate electrode end and the recess end of the recess region longer on the drain electrode side, i.e., it is desired to make the distance between the gate electrode end and the recess end on the source electrode side of the gate electrode recess region, shorter than the distance between the recess end on the drain electrode side of the recess region (low resistance layer removal region) where the gate electrode is formed and gate electrode end on the drain electrode side, after forming the gate electrode opening in the step of forming a gate electrode opening, and before the step of reducing a gate electrode opening, the step of exposing to an electron beam is performed in which the vicinity of the drain electrode is exposed to larger amount (dosage) of an electron beam than that in the vicinity of the source electrode in the gate electrode opening.

Next, the step of engraving a surface where a gate electrode is to be formed, is performed, in which the low resistance layer in the vicinity of the surface where a gate electrode is to be formed is engraved and removed using the gate electrode opening which determines the length of the low resistance layer removal region (recess region) as a mask, so as to form the low resistance layer removal region (recess region).

Next, when the step of reducing a gate electrode opening is performed using the resist pattern thickening material, the gate electrode opening on the drain electrode side is thickened more than the source electrode side, the reduction amount of the opening dimension on the drain electrode side is larger than the reduction amount of the opening dimension on the source electrode side, so the gate electrode opening in the recess region is formed (displaced) in a position offset to the source electrode side.

Next, when the gate electrode is formed in the step of forming a gate electrode, an offset gate electrode is manufactured.

Step of Engraving the Surface where Gate Electrode is to be Formed

The step of engraving the surface where a gate electrode is to be formed is a step in which the surface where a gate electrode is to be formed is engraved using the gate electrode opening as a mask.

The step of engraving the surface where a gate electrode is to be formed is, for example, performed by etching. The etching is not particularly limited. For example, dry etching and the like is preferred.

The etching conditions are not particularly limited and may be suitably selected according to the purpose.

The step of engraving the surface where a gate electrode is to be formed is preferably performed after the step of forming a gate electrode opening and before the step of reducing a gate electrode opening, and if the step of exposing to an electron beam is performed, it is more preferably performed after the step of forming a gate electrode opening but before the step of reducing a gate electrode opening and step of exposing to an electron beam.

If the step of engraving the surface where a gate electrode is to be formed is performed after the step of forming a gate electrode opening and before the step of reducing a gate electrode opening, a superfine and high precision offset gate (offset recess) which could not be achieved in the conventional technique in which the gate electrode opening is formed after forming the recess region opening to form the recess region, can now be formed using only one opening, i.e., without using both the recess region opening and the gate electrode opening.

When the step of engraving the surface where a gate electrode is to be formed is performed after the step of forming a gate electrode opening and before the step of reducing a gate electrode opening, first, the gate electrode opening is formed, the recess region is formed by engraving using the gate electrode opening as a mask, the gate electrode opening is reduced, and the gate electrode is formed using this reduced gate electrode opening as a mask. Therefore, there is no position offset between the recess region and the gate electrode (fine gate electrode). The patterning to form the gate electrode recess region (low resistance layer removal region) where the gate electrode is to be formed, and the patterning to form the electrode opening, are performed in one operation, so it is not necessary to align the openings during patterning. If this opening position alignment were required, the precision of the gate electrode surrounding structure would be determined by the alignment precision and therefore limited. If the alignment precision is insufficient and there is an offset, an offset may occur between the recess region and the gate electrode which is to be formed. In ultra-high frequency devices, the distance from the gate electrode (fine gate electrode) end to the recess end of the recess region is about 0.1 µm or less, and if there is any scatter in this distance due to offset, the integrity of the device deteriorates which leads to a decrease of circuit operating frequency and disparity of device properties. However, if the step of engraving the surface where a gate electrode is to be formed is performed after the step of forming a gate electrode opening and before the step of reducing a gate electrode opening, position alignment is not required, layer superimposition of the electron beam lithography apparatus is not required, and the above-mentioned problem does not occur.

In order to form the recess region and gate electrode opening using one opening, it is required to make the dimensions of the recess region opening about 0.2 µm, and then reduce the dimensions of the opening to about 0.1 µm. According to the present invention, in the step of reducing a gate electrode opening, the resist pattern thickening material is used to thicken the gate electrode opening having opening dimensions of about 0.2 µm, so the dimensions of the gate electrode opening can easily be reduced to about 0.1 µm.

The reduction amount of the gate electrode opening dimension depends on the function and purpose of the semiconductor device, such as a transistor, which is being manufactured, but in the present invention, the reduction amount can easily be controlled to any desired degree by suitably varying the exposure dose of electron beam in the step of exposing to an electron beam for each gate electrode opening.

If an offset gate can be formed at any desired position, it is easier to design the device. In the present invention, by exposing each gate electrode opening to an electron beam unevenly or non-symmetrically in the step of exposing to an electron beam, the offset amount can be varied to any desired degree. Consequently, a plurality of offset gates having different offset amounts can be produced in the device circuit which is being manufactured.

The gate electrode of the present invention manufactured by the method of manufacturing a gate electrode of the present invention may or may not be an offset gate. The gate electrode may be used in various semiconductor devices, for example, in field effect transistors, and is particularly suitably used for the semiconductor device of the present invention.

(Semiconductor Device and Manufacturing Method Thereof)

The method of manufacturing a semiconductor device of the present invention comprises at least the method of manufacturing a gate electrode of the present invention, and may comprise other steps as required.

The other steps are not particularly limited and may be suitably selected from among those known in the art depending on the semiconductor device which is being manufactured.

The semiconductor device of the present invention is manufactured by the method of manufacturing a semiconductor device of the present invention. The semiconductor device of the present invention may be suitably used as a field-effect transistor or an integrated circuit, etc.

The present invention will be illustrated in further detail with reference to several examples below, which are not intended to limit the scope of the present invention.

EXAMPLE 1

A buffer layer, InGaAs electron channel layer, AlGaAs electron supply layer and GaAs low-resistance layer were sequentially grown by MOCVD, an active region was formed by oxygen injection, and an ohmic electrode was formed using an AuGe(20 nm)/Au(200 nm) electrode.

Next, in the active region of the surface where the gate electrode is to be formed, a recess region was formed by engraving and removing low-resistance layer part in a region having a width of 0.2 µm, which region is between the both ends of the part where a fine gate (gate electrode) is to be formed.

Figure 2:
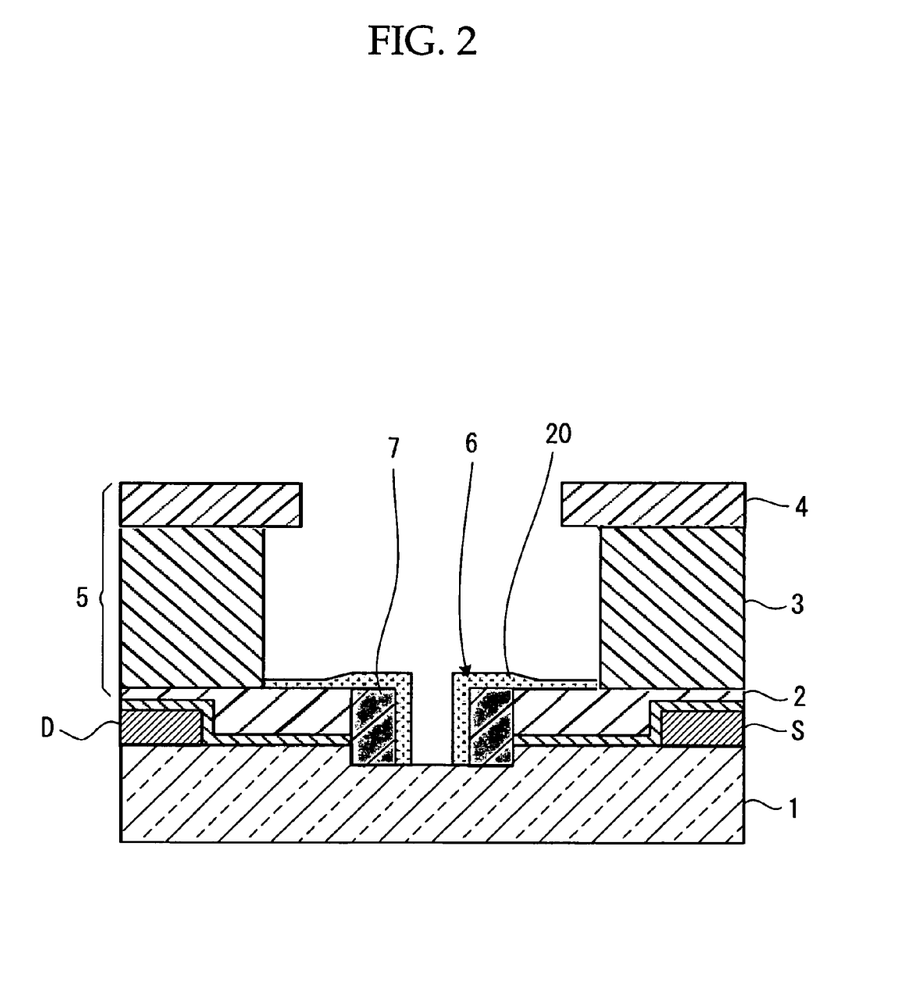
FIG. 2 is a schematic diagram for describing an example of the method of manufacturing the gate electrode method according to the present invention.

Next, as shown in FIG. 2, a PMMA resist (ZEP2000, product of Zeon Corp.) was coated by spin coating method to a thickness of 300 nm on a substrate 1 where the gate electrode is to be formed, followed by heat treatment at 180° C. for 5 minutes, to form a lowermost layer 2. PMGI (product of MicroChem Corp.) was then coated by spin coating method to a thickness of 500 nm thereupon, followed by heat treatment at 180° C. for 3 minutes, to form an intermediate layer 3. A polystyrene polymer-containing resist (ZEP520-A7, product of Zeon Corp.) was coated by spin coating method to a thickness of 300 nm thereupon, followed by heat treatment at 180° C. for 3 minutes, to form an uppermost layer 4. In this way, a multi-layer resist 5 having a three-layer structure was formed. This is the step of forming a multi-layer resist.

Next, as shown in FIG. 2, electron beam lithography was performed on the uppermost layer 4 of the multi-layer resist 5 to form an opening having a width of 0.7 µm in the current direction in the uppermost layer 4. Next, side-etching was performed using an alkali developing solution on the intermediate layer 3 which was exposed from the opening. This is the step of forming an opening.

Next, electron beam lithography was performed on the lowermost layer 2 exposed from the opening formed by the step of forming an opening, so as to form a gate electrode opening having a width of 0.12 µm in the current direction. This is the step of forming a gate electrode opening.

Next, the vicinity of the gate electrode opening was symmetrically exposed to an electron beam at a dose (60 µC) below the developing Eth, which is the dosage amount at which the lowermost layer 2 is developed, so as to form an electron beam exposure region 7. This is the step of exposing to an electron beam.

Figure 3:
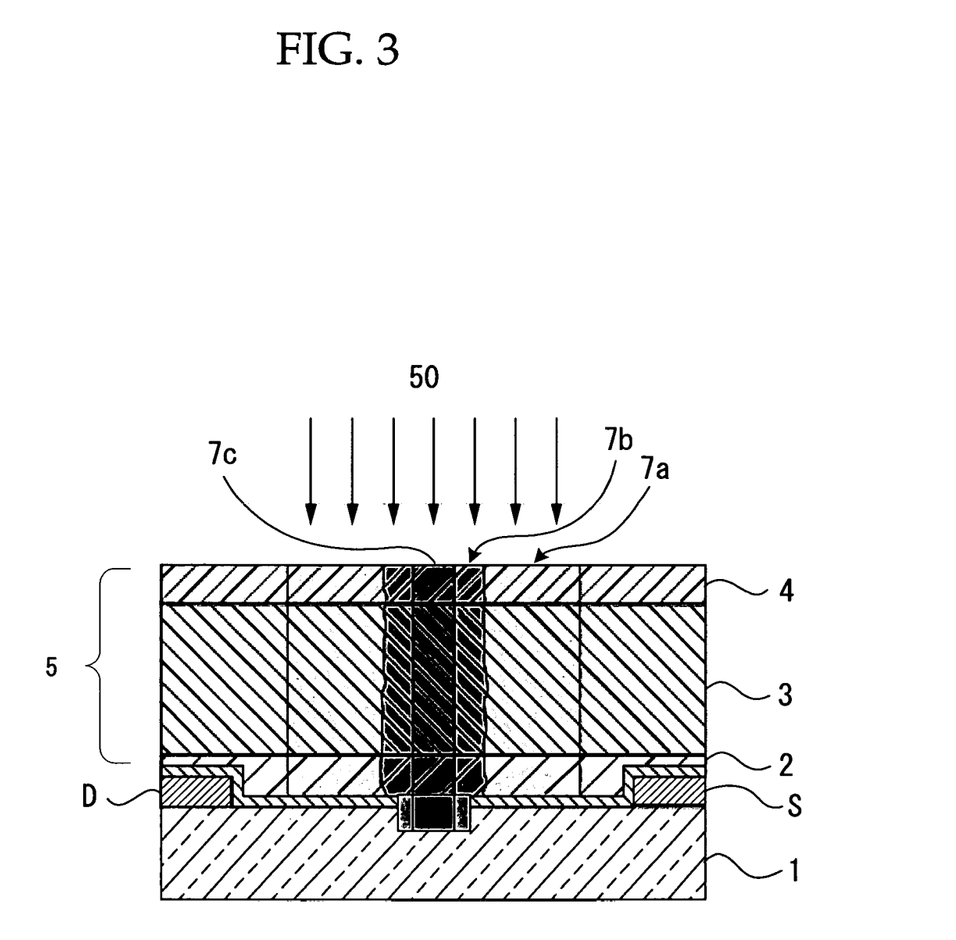
FIG. 3 is a schematic diagram for describing an example of the step of exposing to an electron beam in the gate electrode manufacturing method of the present invention.

The dosage amount in Example 1 is 60 µC. When the lowermost layer 2 constitutes the multi-layer resist 5 together with the intermediate layer 3 and uppermost layer 4 without being exposed, the electron beam can also be irradiated from above the multi-layer resist 5. For example, as shown in FIG. 3, electron beam exposure regions 7a, 7b, 7c may be formed by varying the exposure dose of an electron beam 50 to the multi-layer resist 5 from above the multi-layer resist 5. The dosage amount in this case is preferably about 90 µC. In this case, patterning can be completed by performing electron beam lithography only once.

Next, the step of reducing a gate electrode opening was performed. First, the resist pattern thickening material was prepared. Specifically, the material contained 16 parts by mass of polyvinylacetal resin (product of Sekisui Chemical Co., Ltd., KW-3) as the resin, 1 mass part of tetramethoxymethyl glycoluril (product of Sekisui Chemical Co., Ltd.) as the crosslinking agent, and 0.0625 parts by mass of polyoxyethylene monoalkylether surfactant (product of Asahi Denka Kogyou K.K., TN-80, non-ionic surfactant) as the surfactant. A mixed solution of pure water (de-ionized water) and isopropyl alcohol (mass ratio of pure water (de-ionized water): isopropyl alcohol=82:0.4) was used as the main solvent component excluding the resin, crosslinking agent and surfactant. Next, as shown in FIG. 2, this resist pattern thickening material was coated by spin coating at 300 rpm for 60 seconds and was prebaked at 85° C. for 70 seconds. Thus, the gate electrode opening and resist pattern thickening material were mixed to form a mixing layer 6 as shown in FIG. 2. Subsequently, a crosslinking bake was performed at 95° C. for 70 seconds to crosslink the mixing layer 6 and form a crosslinking mixing layer 20. Developing treatment was then performed with water for 60 seconds, and the resist pattern thickening material other than the crosslinked part was thereby dissolved away.

As a result, simply by coating the resist pattern thickening material on the gate electrode opening, the opening dimensions of the specific opening of the gate electrode openings, specifically the opening which had been dosed with the electron beam in the step of exposing to an electron beam, was finely reduced to 0.08 µm, and other opening dimensions were also finely reduced to 0.1 µm. During the step of reducing a gate electrode opening, the opening dimensions in the intermediate layer 3 and uppermost layer 4 did not vary.

Next, the step of forming a gate electrode was performed. Specifically, a gate electrode in which the Ti thickness was 10 nm, Pt thickness was 10 nm and Au thickness was 300 nm, was formed by vapor deposition using a high vacuum vapor deposition apparatus. Subsequently, a fine T-shaped gate electrode was formed by removing the multi-layer resist by the lift-off method (N-methyl-2-pyrolidinone, 75° C., 60 minutes).

EXAMPLE 2

This example is identical to Example 1, except that the step of engraving the surface where a gate electrode is to be formed in Example 1 is performed after the step of forming a gate electrode opening, and before the step of exposing to an electron beam and step of reducing a gate electrode opening.

Figure 4A:
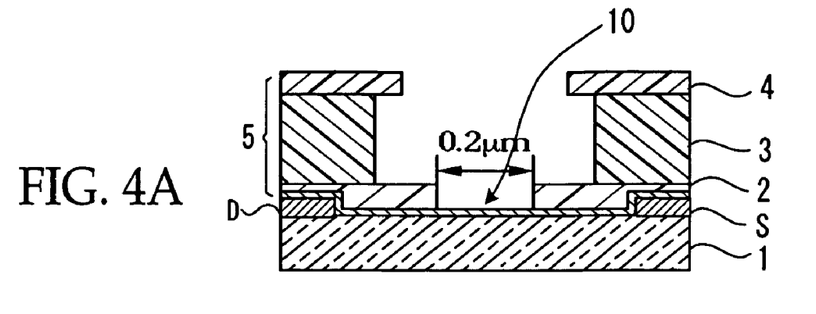
FIGS. 4A, 4B, 4C and 4D are schematic diagrams for describing an example of manufacturing the gate electrode of the present invention (example using one opening where opening position adjustment is not required) by method of manufacturing the gate electrode of the present invention.

Specifically, as shown in FIG. 4A, a source electrode S and drain electrode D were formed at a fixed interval on the surface of a semiconductor substrate, and the SiN film was deposited on the surface of semiconductor substrate. The multi-layer resist 5 comprising the lowermost layer 2, intermediate layer 3 and uppermost layer 4 was then formed on the SiN film by the step of forming a multi-layer resist. Next, an opening was formed in the uppermost layer 4 and the intermediate layer 3 in the multi-layer resist 5 by the step of forming an opening. A gate electrode opening 10 having opening dimensions of 0.2 µm was then formed by the step of forming a gate electrode opening.

Figure 4B:
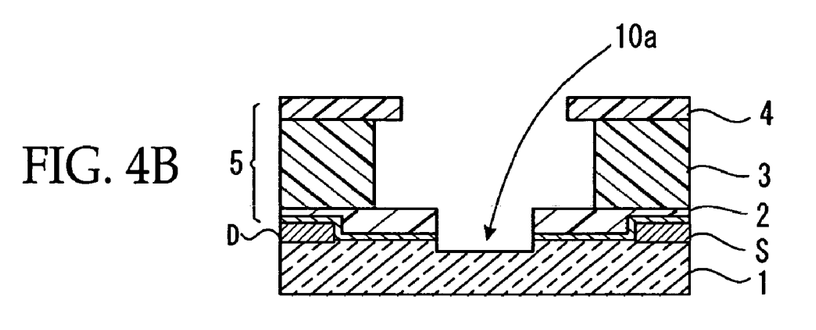

Next, as shown in FIG. 4B, a recess region (low resistance layer removal region) 10a was formed by engraving and removing a low resistance layer part of the semiconductor substrate surface, using the gate electrode opening 10 as a mask, in step of engraving the surface where a gate electrode is to be formed.

Figure 4C:
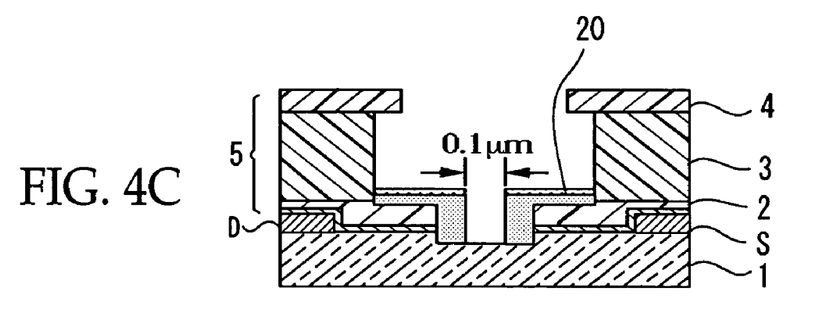
Figure 4D:
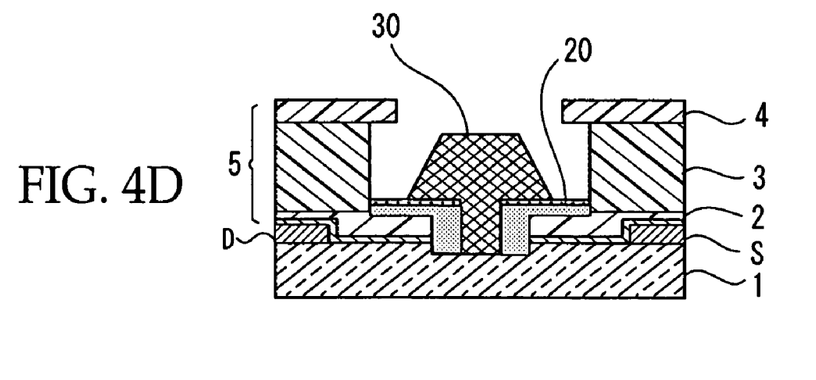

Next, in the same way as in Example 1, the step of exposing to an electron beam and step of reducing a gate electrode opening was performed, and as shown in FIG. 4C, the opening dimensions of 0.2 µm of the gate electrode opening were reduced to 0.1 µm. Next, in the same way as in Example 1, the step of forming a gate electrode was performed to form a gate electrode 30 as shown in FIG. 4D. The multi-layer resist 5 was then dissolved away by the lift-off method to leave the fine gate electrode (mushroom gate electrode) 30 on the surface where a gate electrode is to be formed.

In Example 2, the prebake was performed at 95° C. for 70 seconds, and the crosslinking bake was performed at 105° C. for 70 seconds. The dosage amount in the step of exposing to an electron beam of Example 2 was 60 µC as in the case of Example 1. In a case where the lowermost layer 2 is not exposed and constitutes the multi-layer resist 5 together with the intermediate layer 3 and uppermost layer 4, the electron beam can also be irradiated from above the multi-layer resist 5. For example, the electron beam exposure regions 7a, 7b, and 7c may be formed by varying exposure dose of electron beam 50 to the multi-layer resist 5 from above the multi-layer resist 5, and the dosage amount in the step of exposing to an electron beam in this case is preferably about 90 µC. In this case, patterning can be completed by performing electron beam lithography only once.

Thus, a field effect transistor having a fine gate electrode was obtained. In this field effect transistor, the recess length on the source electrode S side and the drain electrode D side are mutually identical with respect to the gate electrode 30.

EXAMPLE 3

Figure 5A:
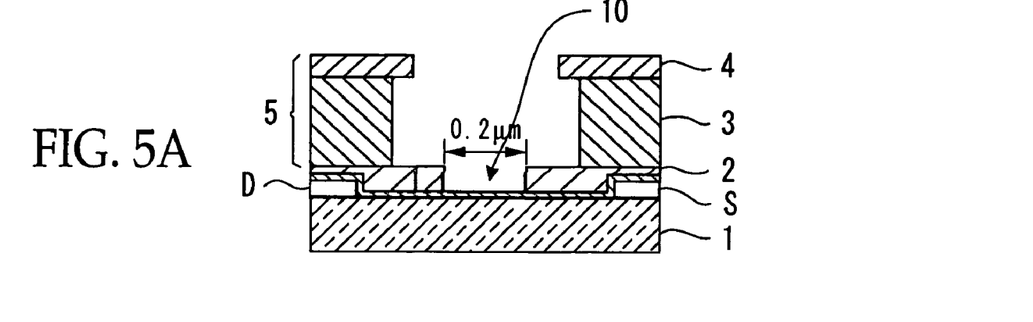
FIGS. 5A, 5B, 5C and 5D are schematic diagrams for describing an example of manufacturing the gate electrode of the present invention (offset gate) by the gate electrode manufacturing method of the present invention.
Figure 5B:
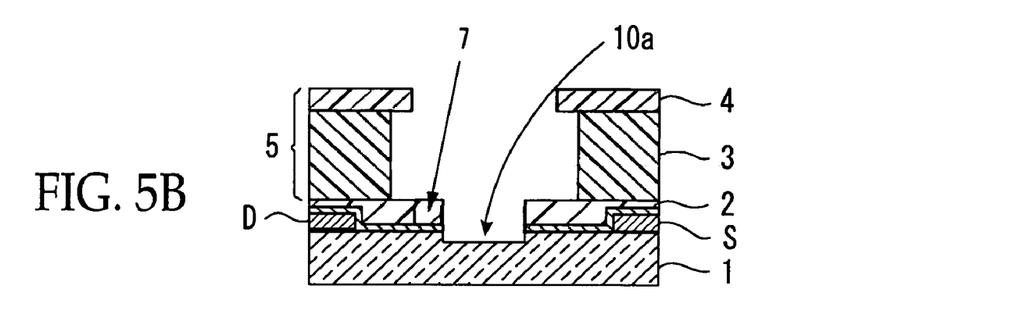
Figure 5C:
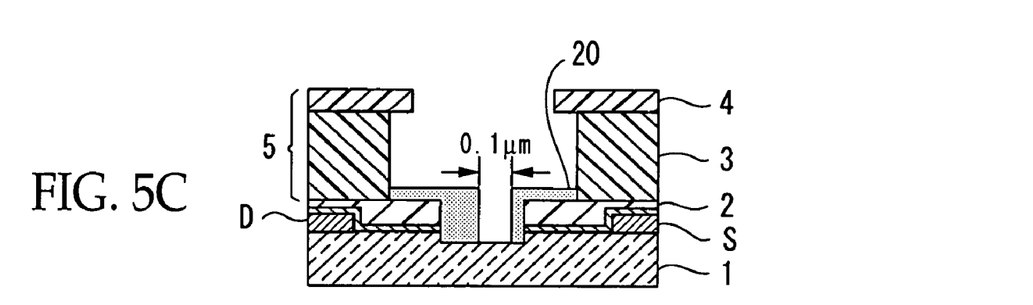

In the step of exposing to an electron beam in Example 2, in order to selectively reduce the opening dimensions on the drain electrode D side in the gate electrode opening, only the drain electrode D side was exposed to a dose (60 µC) below the developing Eth (FIGS. 5A to 5C).

Figure 5D:
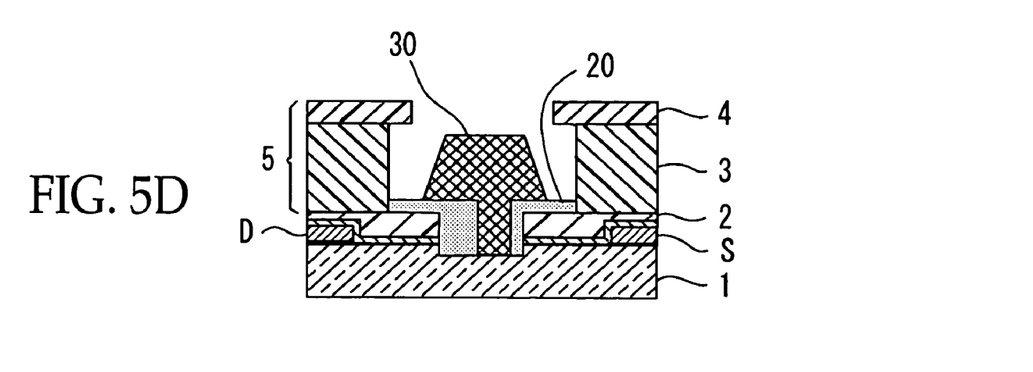

As a result, as shown in FIG. 5D, a field effect transistor having an offset gate in which the recess length on the drain electrode D side was 0.04 µm longer than the recess length on the source electrode S side with respect to the gate electrode 30, was obtained.

The present invention provides a method of manufacturing a gate electrode in which a fine gate electrode can effectively be manufactured by thickening a resist opening for gate electrodes formed by ordinary electron beam lithography so as to reduce opening dimensions. The present invention also provide a gate electrode which is manufactured by the method of manufacturing a gate electrode and is used favorably for a field-effect transistor which has excellent high frequency properties and is useful for a transmitting and receiving device of quasi-millimeter and millimeter band waves or a high-speed signal processing (optical communication) device. Further, the present invention provides a high-performance semiconductor device using the gate electrode and a method of efficiently manufacturing thereof.

What is claimed is:

1. A method of manufacturing a gate electrode, comprising the steps of: forming a multi-layer resist which comprises at least an electron beam resist layer as a lowermost layer, on a surface where a gate electrode is to be formed;

forming an opening in layer(s) other than the lowermost layer;

forming a gate electrode opening in the lowermost layer exposed from the opening;

exposing the vicinity of the gate electrode opening to an electron beam;

reducing the gate electrode opening selectively;

forming the gate electrode in the gate electrode opening; and removing the multi-layer resist after forming the gate electrode, wherein the step of exposing to an electron beam is performed before the step of reducing the gate electrode opening, and wherein the vicinity of the gate electrode opening was exposed to an electron beam at a dose below the dosage amount at which the lowermost layer is developed.

2. A method of manufacturing a gate electrode according to claim 1, wherein the step of reducing the gate electrode opening is a step in which a resist pattern thickening material is coated on the surface of the lowermost layer to thereby reduce the opening dimensions of the gate electrode opening formed in the lowermost layer, at least once.

3. A method of manufacturing a gate electrode according to claim 1, wherein an exposure dose of the electron beam is a dosage amount less than the developing Eth.

4. A method of manufacturing a gate electrode according to claim 1, wherein, in the step of exposing to an electron beam, the vicinity of the gate electrode opening is exposed to the electron beam symmetrically.

5. A method of manufacturing a gate electrode according to claim 1, wherein, in the step of exposing to an electron beam, the vicinity of the gate electrode opening is exposed to the electron beam non-symmetrically.

6. A method of manufacturing a gate electrode according to claim 1, wherein the reduction amount of the gate electrode opening dimensions in the step of reducing the gate electrode opening is adjusted by varying the exposure dose of the electron beam in the step of exposing to an electron beam.

7. A method of manufacturing a gate electrode according to claim 1, further comprising a step of engraving the surface where a gate electrode is to be formed using the gate electrode opening as a mask, wherein the step of engraving the surface where a gate electrode is to be formed, is performed after the step of forming a gate electrode opening and before the step of reducing the gate electrode opening.

8. A method of manufacturing a gate electrode according to claim 7, wherein the step of engraving the surface where a gate electrode is to be formed is performed by one of dry etching and wet etching.

9. A method of manufacturing a gate electrode according to claim 1, wherein the lowermost layer comprises a material capable of being thickened by a resist pattern thickening material.

10. A method of manufacturing a gate electrode according to claim 1, wherein the lowermost layer comprises an electron beam resist.

11. A method of manufacturing a gate electrode according to claim 1, wherein the lowermost layer comprises a polymethyl methacrylate (PMMA) resist.

12. A method of manufacturing a gate electrode according to claim 1, wherein an intermediate layer immediately above the lowermost layer is capable of being side-etched.

13. A method of manufacturing a gate electrode according to claim 1, wherein an intermediate layer immediately above the lowermost layer comprises a photoresist.

14. A method of manufacturing a gate electrode according to claim 1, wherein an intermediate layer immediately above the lowermost layer comprises a poly methyl glutarimide (PMG) resist.

15. A method of manufacturing a gate electrode according to claim 1, wherein an uppermost layer comprises an electron beam resist.

16. A method of manufacturing a gate electrode according to claim 1, wherein an uppermost layer comprises a polystyrene polymer-containing resist.

17. A method of manufacturing a gate electrode according to claim 1, wherein the multi-layer resist comprises three layers, and wherein the lowermost layer comprises a polymethyl methacrylate (PMMA) resist, an intermediate layer immediately above the lowermost layer comprises a polymethyl glutarimide (PMGI) resist, and an uppermost layer immediately above the intermediate layer comprises a polystyrene polymer-containing resist.

18. A method of manufacturing a gate electrode according to claim 1, wherein, when the step of forming the gate electrode is performed, the opening and the gate electrode opening are not positioned concentrically.

19. A method of manufacturing a gate electrode according to claim 1, wherein the step of forming the gate electrode is performed by forming the gate electrode.

20. A method of manufacturing a gate electrode according to claim 19, wherein the removal of the multi-layer resist is performed by the lift-off method.

21. A method of manufacturing a gate electrode according to claim 2, wherein the resist pattern thickening material comprises a resin, a crosslinking agent and a surfactant.

22. A method of manufacturing a gate electrode according to claim 21, wherein the resist pattern thickening material is at least one of water-soluble and alkali-soluble.

23. A method of manufacturing a gate electrode according to claim 21, wherein the surfactant is a non-ionic surfactant.

24. A method of manufacturing a gate electrode according to claim 21, wherein the resin is at least one selected from the group consisting of polyvinyl alcohol, polyvinyl acetal and polyvinyl acetate.

25. A method of manufacturing a gate electrode according to claim 21, wherein the crosslinking agent is at least one selected from the group consisting of a melamine derivative, a urea derivative and an uril derivative.

26. A method of manufacturing a gate electrode according to claim 21, wherein the resist pattern thickening material comprises at least one selected from the group consisting of a water-soluble aromatic compound and a resin comprising an aromatic compound in a portion thereof.

27. A method of manufacturing a gate electrode according to claim 26, wherein the water-soluble aromatic compound is one selected from the group consisting of a polyphenol compound, an aromatic carboxylic acid compound, a naphthene polyhydric alcohol compound, a benzophenone compound, a flavonoid compound, derivatives thereof and glycosides thereof, and wherein the resin comprising an aromatic compound in a portion thereof is one selected from the group consisting of a polyvinyl aryl acetal resin, a polyvinyl aryl ether resin and a polyvinyl aryl ester resin.

28. A method of manufacturing a gate electrode according to claim 21, wherein the resist pattern thickening material further comprises an organic solvent.

29. A method of manufacturing a gate electrode according to claim 28, wherein the organic solvent is at least one selected from the group consisting of an alcohol solvent, a straight-chain ester solvent, a cyclic ester solvent, a ketone solvent, a straight-chain ether solvent and a cyclic ether solvent.

30. A method of manufacturing a semiconductor device comprising a method of manufacturing a gate electrode, wherein the method of manufacturing a gate electrode comprises the steps of:

forming a multi-layer resist which comprises at least an electron beam resist layer as a lowermost layer, on a surface where a gate electrode is to be formed;

forming an opening in layer(s) other than the lowermost layer;

forming a gate electrode opening in the lowermost layer exposed from the opening;

exposing the vicinity of the gate electrode opening to an electron beam;

reducing the gate electrode opening selectively; and forming the gate electrode in the gate electrode opening; and removing the multi-layer resist after forming the gate electrode, wherein the step of exposing to an electron beam is performed before the step of reducing the gate electrode opening, and wherein the vicinity of the gate electrode opening was exposed to an electron beam at a dose below the dosage amount at which the lowermost layer is developed.

* * * * *